United States Patent
Chung et al.

(10) Patent No.: US 11,810,799 B2
(45) Date of Patent: Nov. 7, 2023

(54) LASER PROCESSING APPARATUS AND LASER PROCESSING METHOD

(71) Applicant: JSW AKTINA SYSTEM CO., LTD., Yokohama (JP)

(72) Inventors: Suk-Hwan Chung, Kanagawa (JP); Masashi Machida, Kanagawa (JP)

(73) Assignee: JSW AKTINA SYSTEM CO., LTD., Kanagawa (JP)

(*) Notice: Subject to any disclaimer, the term of this patent is extended or adjusted under 35 U.S.C. 154(b) by 989 days.

(21) Appl. No.: 16/342,182

(22) PCT Filed: Oct. 10, 2017

(86) PCT No.: PCT/JP2017/036660
§ 371 (c)(1),
(2) Date: Apr. 15, 2019

(87) PCT Pub. No.: WO2018/074283
PCT Pub. Date: Apr. 26, 2018

(65) Prior Publication Data
US 2019/0326140 A1 Oct. 24, 2019

(30) Foreign Application Priority Data
Oct. 20, 2016 (JP) .................. 2016-206095

(51) Int. Cl.
*H01L 21/67* (2006.01)
*B23K 26/082* (2014.01)
(Continued)

(52) U.S. Cl.
CPC ...... *H01L 21/67115* (2013.01); *B23K 26/082* (2015.10); *B23K 26/1437* (2015.10);
(Continued)

(58) Field of Classification Search
CPC ...... B23K 26/08; B23K 26/082; B23K 26/50; B23K 26/00; B23K 26/14
(Continued)

(56) References Cited

U.S. PATENT DOCUMENTS 8,575,515 B2 * 11/2013 Kawaguchi ........... H01L 21/268
219/121.84

FOREIGN PATENT DOCUMENTS

JP 2002217124 A 8/2002
JP 2005074466 A * 3/2005
(Continued)

OTHER PUBLICATIONS

Machine tranalstion of JP 2005-074466 performed on Mar. 18, 2022.*
(Continued)

*Primary Examiner* — Tu B Hoang
*Assistant Examiner* — Alba T Rosario-Aponte
(74) *Attorney, Agent, or Firm* — Holtz, Holtz & Volek PC

(57) ABSTRACT

A laser processing apparatus includes: a scan moving unit which moves one or both of a workpiece and a laser beam; a laser beam irradiation unit which irradiates the workpiece with the laser beam; and a gas discharge unit which discharges at least a first gas to an irradiation area irradiated with the laser beam in the workpiece. The gas discharge unit has a rectifying surface at a position facing the workpiece during laser beam irradiation. The rectifying surface is provided with a first gas discharge port through which the first gas is discharged; and one or both of a second gas discharge port and a gas front-back suction port. The second gas discharge port discharges a second gas to the workpiece during laser beam irradiation on both outer sides of the first gas discharge port at least in the scanning direction.

15 Claims, 12 Drawing Sheets

(51) Int. Cl.
*B23K 26/14* (2014.01)
*B23K 26/50* (2014.01)
*H01L 21/268* (2006.01)
*H01L 21/324* (2006.01)

(52) U.S. Cl.
CPC ............ *B23K 26/50* (2015.10); *H01L 21/268* (2013.01); *H01L 21/324* (2013.01)

(58) Field of Classification Search
USPC ... 219/121.84, 121.6, 121.78, 121.79, 121.8, 219/121.82
See application file for complete search history.

(56) References Cited

FOREIGN PATENT DOCUMENTS

| | | | | |
|---|---|---|---|---|
| JP | 2005074466 | A | | 3/2005 |
| JP | 2006108271 | A | | 4/2006 |
| JP | 2006253285 | A | | 9/2006 |
| JP | 2007288128 | A | | 11/2007 |
| JP | 2008244195 | A | * | 10/2008 |
| JP | 2008311249 | A | | 12/2008 |
| JP | 2012064963 | A | * | 3/2012 ......... B23K 26/1464 |
| JP | 5408678 | B2 | | 2/2014 |
| KR | 20070096845 | A | | 10/2007 |
| KR | 20090018782 | A | | 2/2009 |
| WO | 2008152873 | A1 | | 12/2008 |

OTHER PUBLICATIONS

English Language Translation of Written Opinion dated May 2, 2019 issued in International Application No. PCT/JP2017/036660.
International Search Report (ISR) dated Dec. 19, 2017 issued in International Application No. PCT/JP2017/036660.
Written Opinion dated Dec. 19, 2017 issued in International Application No. PCT/JP2017/036660.

* cited by examiner

LASER PROCESSING APPARATUS AND LASER PROCESSING METHOD

TECHNICAL FIELD

The present invention relates to a laser processing apparatus which performs a desired process by irradiating a workpiece with a laser beam and a laser processing method.

BACKGROUND ART

As a device which performs annealing processing by irradiating a silicon semiconductor film or the like on a substrate with a laser beam, there has been known a device which performs processing by forming a local gas atmosphere surrounding a region to be irradiated with a laser beam on a substrate (for example, see Patent Literatures 1 and 2).

FIG. 12 is a view illustrating an example of a conventional laser processing apparatus.

In the conventional laser processing apparatus, a laser beam irradiation local seal box 110 is provided on a lower portion of a top plate of the processing chamber 100; and a laser beam introduction window 101 is provided on an upper portion of the top plate of the laser beam irradiation local seal box 110. A rectifying plate 111 extending forward and backward in a moving direction of a substrate 120 is continuously formed on a lower surface of the laser beam irradiation local seal box 110.

Nitrogen gas is introduced into the laser beam irradiation local seal box 110, and the nitrogen gas is discharged downward through a laser beam transmission hole 112 provided in a lower surface of the laser beam irradiation local seal box 110.

Further, the processing chamber 100 is provided with a stage 102 which holds the substrate and movable leftward and rightward in the drawing. An inlet/outlet port 104 is provided in a side portion of the processing chamber 100, and the inlet/outlet port 104 is opened and closed by an operation of a gate valve 103.

In the processing, the inlet/outlet port 104 is opened by the gate valve 103 to introduce the substrate 120 into the processing chamber 100. After the substrate 120 is introduced, the inlet/outlet port 104 is closed by the gate valve 103. Anon-single-crystal semiconductor film (unillustrated) is formed on the substrate 120. Note that when the inlet/outlet port 104 is opened, outside air penetrates into the processing chamber 100.

The substrate 120 is held by the stage 102 and moves together with the stage 102 at a predetermined speed inside the processing chamber 100. The substrate 120 is irradiated with a laser beam 130 through the laser beam transmission hole 112. Anon-single-crystal semiconductor film is single-crystallized on the substrate 120 by the irradiation of the laser beam 130. When irradiated with the laser beam 130, the nitrogen gas is discharged from the laser beam transmission hole 112 of the laser beam irradiation local seal box 110 to form a local gas atmosphere so as to surround a laser beam irradiation area, thereby eliminate the influence of outside air as much as possible. When the processed substrate 120 is taken out, the inlet/outlet port is opened by the gate valve 103 to take the substrate 120 out of the processing chamber 100.

CITATION LIST

Patent Literature

[Patent Literature 1] Japanese Patent Laid-Open No. 2002-217124
[Patent Literature 2] Japanese Patent No. 5408678

SUMMARY OF INVENTION

Technical Problem

As described above, in the prior art, a gas is injected toward a substrate along a laser beam axis in the irradiation position of a laser beam with respect to the substrate. However, when a gas flow is injected to the laser beam irradiation position, a turbulent flow occurs around the laser beam irradiation position.

In order to prevent turbulent flow, an improvement has been made to change the injecting gas flow into laminar flow, but it is inevitable to generate turbulent flow due to collision of the gas flow against the substrate. Further, an attempt also has been made to reduce the gas flow velocity to stabilize turbulent flow, but it is difficult to form a uniform atmosphere which is the original purpose. When a turbulent flow occurs, gas pressure or temperature fluctuation occurs. As a result, a change in optical refractive index with respect to the laser occurs, resulting in a non-uniform laser intensity at the laser beam irradiation position, thereby laser beam irradiation process cannot be uniformly performed. Further, vapor or fine particles of a constituent element (for example, Si) generated from a semiconductor film (for example, Si film) by irradiation with a laser beam changes the refractive index of the laser beam on the optical path or blocks the laser. In a state where a turbulent flow occurs or the flow velocity is extremely low, it is difficult to discharge substances such as vapor or fine particles generated from the irradiated object from the optical path of the laser. This problem is solved by a gas suction port of the present invention.

Further, there is a problem that when the substrate is carried into and carried out, a stabilized atmosphere is disturbed by an external gas flow around the laser beam irradiation position. This problem is solved by a second or third gas discharge port of the present invention.

The present invention has been made to solve the above-described problems of the prior art and an object of the present invention is to provide a laser processing apparatus and a laser processing method capable of preventing a turbulent gas flow and maintaining a uniform atmosphere by using any type of gas.

Solution to Problem

More specifically, among the laser processing apparatuses of the present invention, the present invention of a first aspect is a laser processing apparatus which irradiates a workpiece with a laser beam while relatively scanning a laser beam, the laser processing apparatus is characterized in that including:

a scan moving unit moving one or both of the workpiece and the laser beam;

a laser beam irradiation unit irradiating the workpiece with the laser beam; and a gas discharge unit discharging at least a first gas to an irradiation area irradiated with the laser beam in the workpiece, wherein, the gas discharge unit has a rectifying surface at a position facing the workpiece during laser beam irradiation, and the rectifying surface is provided with a first gas discharge port through which the first gas is discharged; and one or both of a second gas discharge port and a gas front-back suction port, the second gas discharge port discharging a second gas to the workpiece during laser beam irradiation on both outer sides of the first gas discharge port at least in the scanning direction.

Further, in the present invention of the first aspect, the invention of the laser processing apparatus of another aspect is characterized in that, The first gas discharge port is one through which the first gas is discharged in a range covering the irradiation area.

Further, in the present invention of the above aspects, the invention of the laser processing apparatus of still another aspect is characterized in that, the second gas discharge port and the gas front-back suction port have a shape exceeding the shape in a width direction of the irradiation area on both sides.

Further, in the present invention of the above aspects, the invention of the laser processing apparatus of still another aspect is characterized in that, The gas discharge unit includes one or both of a third gas discharge port and a gas side suction port, the third gas discharge port discharging a third gas to the moving workpiece on both sides in the scanning direction.

Further, in the present invention of the above aspects, the invention of the laser processing apparatus of still another aspect is characterized in that, the third gas discharge port and the gas side suction port have a shape exceeding the shape in the scanning direction of the irradiation area on both sides.

Further, in the present invention of the above aspect, the invention of the laser processing apparatus of still another aspect is characterized in that, the gas discharge unit has the second gas discharge port and the gas front-back suction port on one or both of outer sides of the first gas discharge port, and the gas front-back suction port is located inside the second gas discharge port.

Further, in the present invention of the above aspects, the invention of the laser processing apparatus of still another aspect is characterized in that, the second gas discharge port has a predetermined discharge angle for discharging the second gas downward outside by taking the first gas discharge port as a reference.

Further, in the present invention of the above aspect, the invention of the laser processing apparatus of still another aspect is characterized in that, the discharge angle is 45 degrees or more.

Further, in the present invention of the above aspects, the invention of the laser processing apparatus of still another aspect is characterized in that, the rectifying surface has a distance of 10 mm or less from a moving workpiece.

Further, in the present invention of the above aspects, the invention of the laser processing apparatus of still another aspect is characterized in that, the rectifying surface extends with a length of 10 mm or more than the length of the laser beam on the irradiation surface in the scanning direction by taking the first gas discharge port as a reference.

Further, in the present invention of the aspects, the invention of the laser processing apparatus of still another aspect is characterized in that, the second gas discharge port is provided at a position 1 mm or more away in the scanning direction by taking the first gas discharge port as a reference.

Further, in the present invention of the above aspects, the invention of the laser processing apparatus of still another aspect is characterized in that, the laser beam has a line beam shape on the irradiation surface with respect to the workpiece.

Further, in the present invention of the above aspects, the invention of the laser processing apparatus of still another aspect is characterized in that, the workpiece is a non-single-crystal semiconductor, and the laser processing apparatus crystallizes the non-single-crystal semiconductor.

Further, in the present invention of the above aspect, the invention of the laser processing apparatus of still another aspect is characterized in that, the second gas and the third gas are neutralized and supplied to the second gas discharge port and the third gas discharge port.

Further, in the present invention of the above aspects, the invention of the laser processing apparatus of still another aspect is characterized in that, the gas discharged from the rectifying surface is an inert gas.

Further, in the present invention of the above aspects, the invention of the laser processing apparatus of still another aspect is characterized in that, the third gas is an inert gas.

Among the laser processing methods of the present invention, the present invention of a first aspect is a laser processing method of irradiating a workpiece with a laser beam while relatively scanning a laser beam, the laser processing method is characterized in that, including:

having a rectifying surface at a position facing the workpiece located in an irradiation position; and discharging a first gas from the rectifying surface to an irradiation area irradiated with the laser beam, and performing one or both of discharging a second gas and sucking the gas on both outer sides of an area of the rectifying surface to which the first gas is discharged at least in the scanning direction.

Further, in the present invention of the aspect, the invention of the laser processing method of another aspect is characterized in that, the method further performs one or both of discharging a third gas and sucking the gas on both sides of the area of the rectifying surface to which the first gas is discharged when the first gas is discharged.

Further, in the present invention of the above aspects, the invention of the laser processing method of still another aspect is characterized in that, the gas is sucked such that a suction amount of the gas is determined according to a discharge amount of the first gas.

Advantageous Effects of Invention

In short, the present invention can form a local atmosphere by a gas at least around a laser beam irradiation area in a workpiece, and can prevent a turbulent flow from occurring by stabilizing the flow of gas, thereby allowing the processing by laser beam irradiation to be performed in a stable atmosphere.

DESCRIPTION OF EMBODIMENTS

First Embodiment

Figure 2:
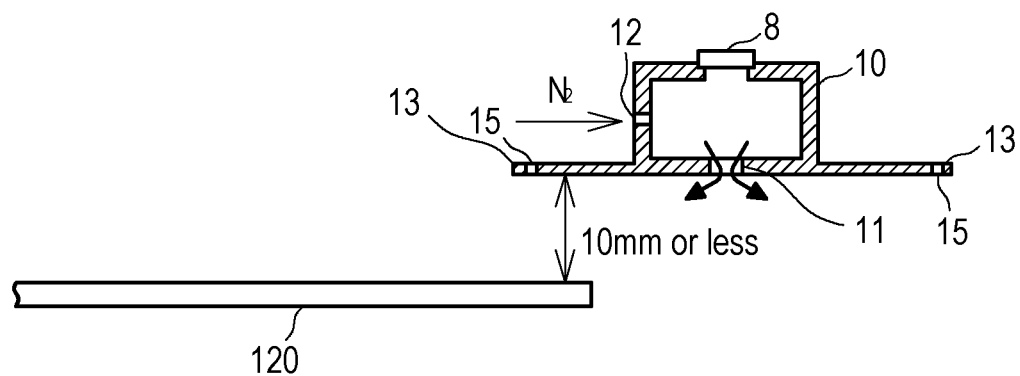
FIG. 2 is an enlarged front view illustrating a configuration around a laser beam irradiation local seal box.
Figure 3:
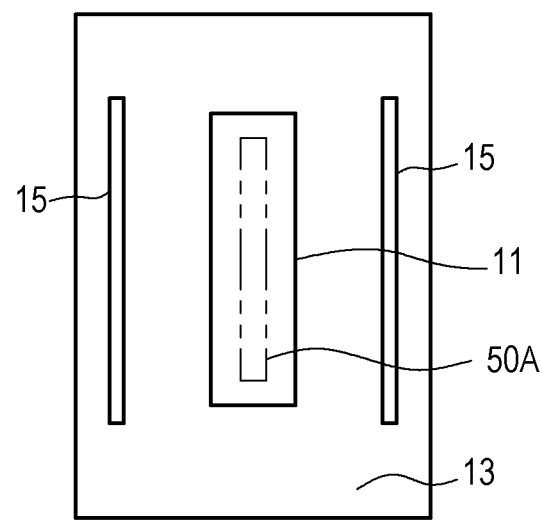
FIG. 3 is a view illustrating a bottom surface of the above laser beam irradiation local seal box.

Hereinafter, an embodiment of the present invention will be described with reference to FIGS. 1 to 3.

A laser processing apparatus 1 includes a processing chamber 2; and a laser light source 3 installed outside the processing chamber 2. The laser processing apparatus 1 can guide a laser beam 50 outputted from the laser light source 3 into the processing chamber 2 through the optical system 4. The optical system 4 includes an attenuator, a lens, a mirror, and the like, which do not limit the configuration of the present invention.

Figure 1:
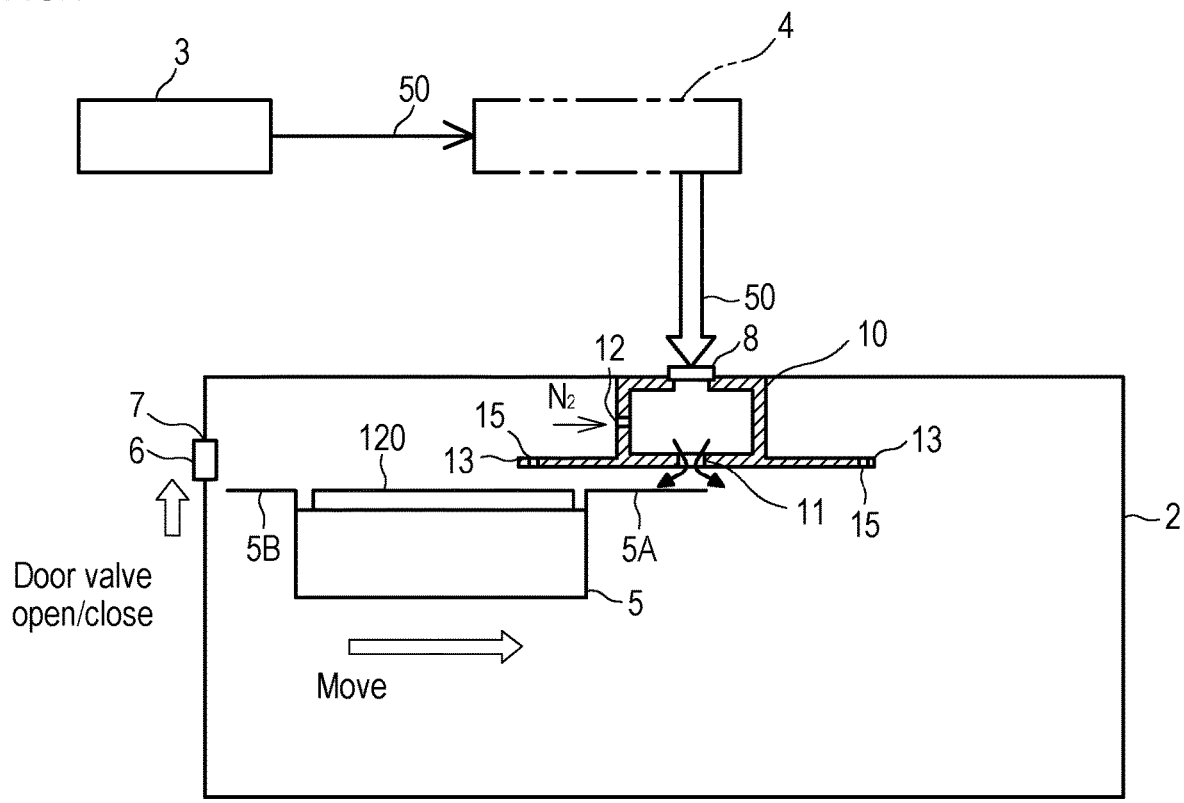
FIG. 1 is a front view illustrating an outline of a laser processing apparatus according to an embodiment of the present invention.

The processing chamber 2 is provided with a stage 5 movable leftward and rightward in FIG. 1 and the stage 5 can hold a substrate 120. The stage 5 includes stage rectifying plates 5A and 5B arranged at the front and rear in a moving direction from a placement surface of the substrate 120. The stage rectifying plates 5A and 5B are attached to the substrate 120 such that the height of the stage rectifying plates 5A and 5B are substantially equal to the height of the substrate 120 when the substrate 120 is placed on the placement surface. It is more desirable that the height of the stage rectifying plates 5A and 5B is equal to the height of the substrate 120 or the height of the stage rectifying plates 5A and 5B is slightly greater than the height of the substrate 120. It is desirable that the length of the stage rectifying plates 5A and 5B is a length in which the stage rectifying plate 5A covers the laser beam transmission hole 11 even if the stage 5 moves to a substrate transfer initial position, and the stage rectifying plate 5B covers the laser beam transmission hole 11 even if the stage 5 moves to an opposite end point of a door valve 6. Further, it is further more desirable that the stage rectifying plates 5A and 5B extend up to a position reaching the entire length of at least the laser beam transmission hole 11 in the scanning direction at each of the above positions.

It should be noted that in this embodiment, relative scanning of laser beam is performed by moving the workpiece by the stage, but in the present invention it can be implemented by moving the laser beam or by moving both the laser beam and the workpiece.

The substrate 120 has an unillustrated non-single-crystal semiconductor film formed on a surface side. In this embodiment, the substrate 120 corresponds to the workpiece of the present invention. The stage 5 corresponds to a workpiece moving device, but the workpiece moving device is not limited to the stage, and for example, can be any device moving the workpiece by floating on a gas. In the present invention, the configuration and the moving method of the moving device are not particularly limited.

Further, a side portion of the processing chamber 2 includes an inlet/outlet port 7 for taking the substrate 120 into and out of the processing chamber 2. The inlet/outlet port 7 is opened and closed by an operation of a door valve 6.

Further, the processing chamber 2 includes a laser beam introduction window 8 at a top plate position. The laser beam introduction window 8 introduces a laser beam 50 emitted from the optical system 4 into the processing chamber 2 from outside the processing chamber 2.

A laser beam irradiation local seal box 10 is provided in the processing chamber 2 on a lower side of the laser beam introduction window 8. The laser beam 50 is emitted downward through the laser beam transmission hole 11 provided on a lower surface of the laser beam irradiation local seal box 10. The laser beam 50 has a line beam shape when emitted from the optical system 4 by the optical system 4. The laser beam transmission hole 11 has a long-hole shape through which the laser beam 50 passes. At this time, an end portion of the short axis or the long axis of the laser beam 50 can be shielded by the laser beam transmission hole 11.

Further, the laser beam irradiation local seal box 10 includes a gas introduction hole 12. Nitrogen gas can be supplied into the laser beam irradiation local seal box 10 through the gas introduction hole 12 from outside of the laser beam irradiation local seal box 10.

A lower surface of the laser beam irradiation local seal box 10 includes a rectifying plate 13 extending beyond both sidewalls of the laser beam irradiation local seal box 10 in a moving direction of the stage 5. The rectifying plate 13 is provided with a laser beam transmission hole 11. The laser beam irradiation local seal box 10 serves as the gas discharge unit of the present invention and the laser beam transmission hole 11 also serves as the first gas discharge port. The first gas discharge port can be provided separately from the laser beam transmission hole 11.

A lower surface of the rectifying plate 13 has a rectifying surface facing and following the substrate 120 moved by the stage 5. It is desirable that the rectifying surface has a distance of 10 mm or less from the substrate 120 moved by the stage 5.

The rectifying plate 13 has gas front-back suction ports 15 each located on both outer sides of the laser beam irradiation local seal box 10 in the moving direction of the stage 5. The gas front-back suction ports 15 have a long-hole shape along the laser beam transmission hole 11, and have a shape exceeding each of both ends in the longitudinal direction of the laser beam transmission hole 11. It is desirable that the gas front-back suction ports 15 are provided at a position near the laser beam transmission hole 11.

Next, the operation of the laser processing apparatus 1 will be described.

As the processing starts, the door valve 6 is operated to open the inlet/outlet port 7. Then, the substrate 120 is introduced into the processing chamber 2 from outside of the processing chamber 2 and is placed on the stage 5. When the substrate 120 is introduced, immediately after the substrate 120 is stored in the processing chamber 2, the inlet/outlet port 7 is closed by the door valve 6.

As the substrate 120 is introduced, nitrogen gas is introduced into the laser beam irradiation local seal box 10 through the gas introduction hole 12. The nitrogen gas corresponds to the first gas of the present invention. The nitrogen gas is discharged downward from the laser beam transmission hole 11. The gas is sucked through the gas front-back suction ports 15 by means of an unillustrated pump or the like. It is desirable that the suction amount of the gas is set to an amount corresponding to the amount of the gas discharged from the laser beam transmission hole 11. As a result, most of the gas discharged from the laser beam transmission hole 11 is sucked from the gas front-back suction ports 15, thereby to form a stable flow of gas. It should be noted that if the distance between the gas front-back suction ports 15 and the laser beam transmission hole 11 is too small, a sufficient flow of gas cannot be formed, and if the distance is too large, it is difficult to stabilize the gas flow.

Meanwhile, the stage 5 places the substrate 120 thereon and moves at a predetermined speed in the right direction in FIG. 1.

When the stage rectifying plate 5A attached to the stage 5 reaches a gas flow position, the flow of gas on a lower side is suppressed to further stabilize the flow of gas from the laser beam transmission hole 11 to the gas front-back suction ports 15. In addition, the laser light source 3 outputs the laser beam 50 and the optical system 4 performs the adjustment of the energy of the laser beam, the forming of the beam, and the equalization of the beam-shaped energy intensity, and the like, to form a line beam shape, so that the line-beam-shaped laser beam 50 is emitted from the optical system 4. The line-beam-shaped laser beam 50 is introduced into the laser beam irradiation local seal box 10 through the laser beam introduction window 8 and then emitted downward through the laser beam transmission hole 11.

The laser beam 50 is emitted downward through the laser beam transmission hole 11 while the substrate 120 is being moved on the stage 5. As the stage 5 moves, the laser beam 50 is relatively scanned against the substrate 120. At this time, a laser beam irradiation area 50A on the substrate 120 is covered with nitrogen gas and there is formed a local atmosphere in which nitrogen flows stably, thereby excellent laser processing can be performed. In addition, after the substrate 120 passes over the laser beam transmission hole 11, the stage rectifying plate 5B remains for a while below the laser beam transmission hole 11, thus maintaining a more stable state of the flow of gas from the laser beam transmission hole 11 to the gas front-back suction port 15 on the front side, and thus providing a better crystallization.

In this embodiment, a non-single-crystal semiconductor film (such as an amorphous silicon film and a polycrystalline silicon film) is formed and a single-crystallized semiconductor film is obtained by laser beam irradiation. Therefore, in this embodiment, the laser beam processing apparatus can be referred to as a laser beam crystallization apparatus.

After the processing, the processed substrate 120 can be taken out of the processing chamber by opening the inlet/outlet port 7 by means of the door valve 6.

It should be noted that this embodiment has been described to have the gas front-back suction ports arranged at the front and rear of the first gas discharge port in the moving direction, but in addition to this, a gas side suction port arranged on a side of the first gas discharge port also can be included.

Second Embodiment

Figure 4:
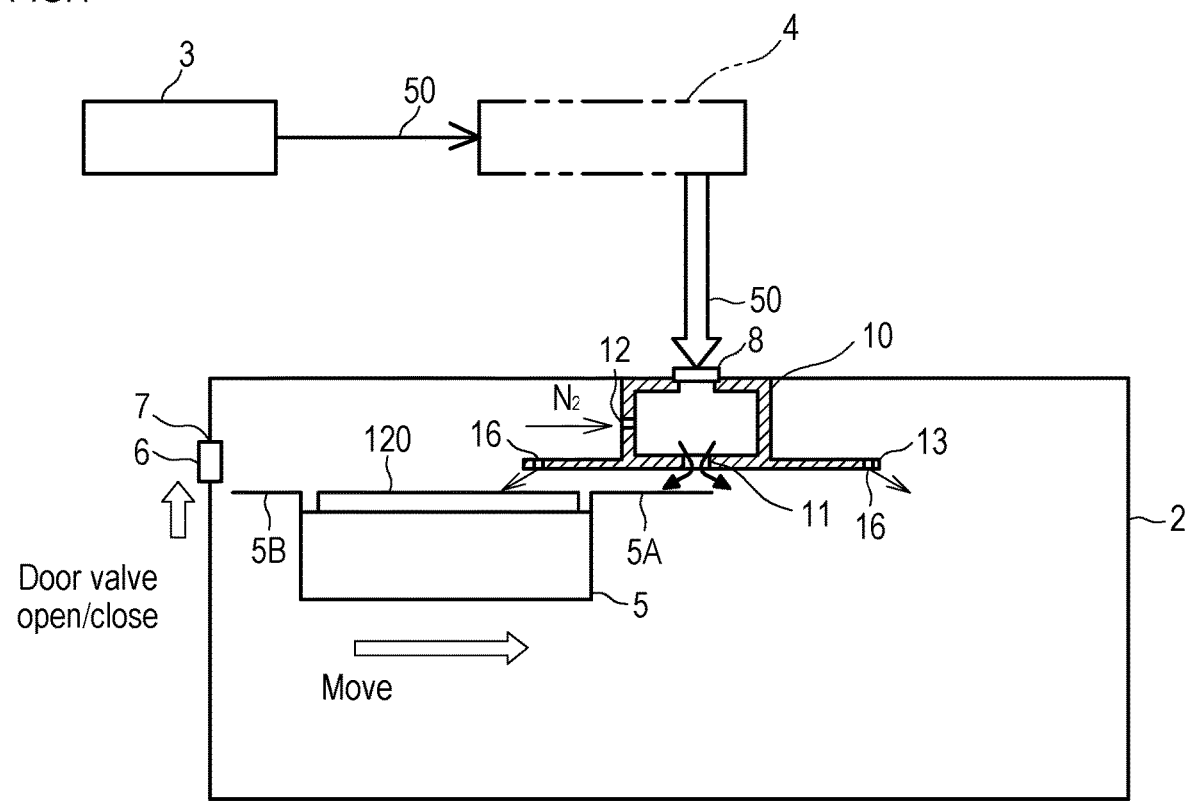
FIG. 4 is a front view illustrating an outline of a laser processing apparatus according to another embodiment of the present invention.
Figure 5:
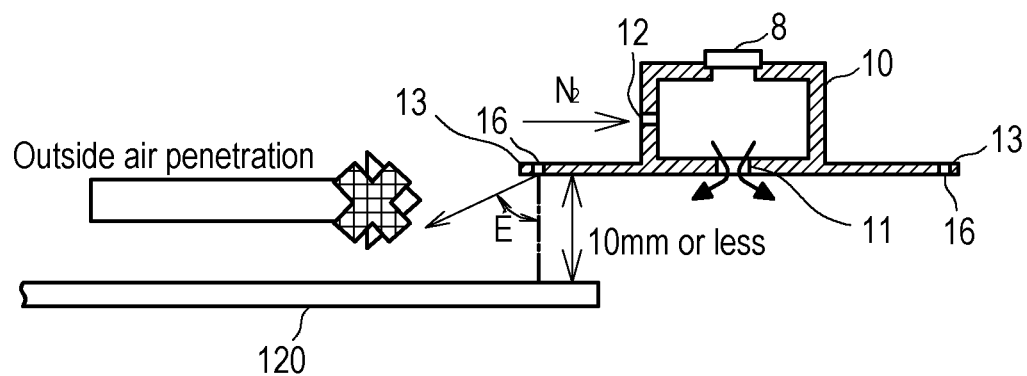
FIG. 5 is an enlarged front view illustrating a configuration around a laser beam irradiation local seal box.
Figure 6:
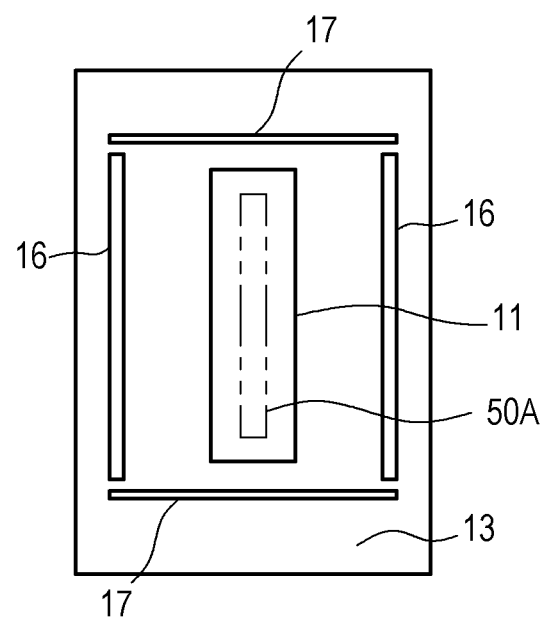
FIG. 6 is a view illustrating a bottom surface of the above laser beam irradiation local seal box.

Next, a laser processing apparatus 1A according to another embodiment will be described with reference to FIGS. 4 to 6.

Note that in this second embodiment, the same reference numerals or characters are assigned to the components which are the same as or similar to those of the first embodiment, and the description is omitted or simplified.

Also, in the second embodiment, the processing chamber 2 includes the laser beam irradiation local seal box 10 and the rectifying plate 13 provided on a lower surface of the laser beam irradiation local seal box 10. Further, the rectifying plate 13 has the laser beam transmission hole 11. Also, in this embodiment, the rectifying surface on a lower surface side of the rectifying plate 13 is set to have a distance of 10 mm or less from the substrate 120 moving on the stage 5.

In the second embodiment, the rectifying plate 13 includes a second gas discharge port 16 for discharging a second gas on each of both outer sides of the laser beam irradiation local seal box 10 in the moving direction of the stage 5; and a third gas discharge port 17 for discharging a third gas on each of both sides of the laser beam irradiation local seal box 10.

The second gas discharge ports 16 have a long-hole shape along the laser beam transmission hole 11, and has a shape exceeding each of both ends in the longitudinal direction of the laser beam transmission hole 11. It is also desirable that the center of the second gas discharge port 16 is provided at an end of the laser beam irradiation local seal box 10.

It is also desirable that the second gas discharge ports 16 have a discharge angle θ for discharging to outside by taking the laser beam transmission hole 11 as a reference. It is desirable that the discharge angle θ has an angle of 45 degrees or more assuming that the vertical direction is 0 degree. Thus, the gas can be discharged toward outside.

In addition, the third gas discharge ports 17 have a long-hole shape along a side of the laser beam transmission hole 11, and have a shape exceeding each of both ends in the short direction of the laser beam transmission hole 11. Further, it is desirable that the third gas discharge ports 17 extend to near the second gas discharge ports 16. Note that in this embodiment, the second gas discharge ports 16 and the third gas discharge ports 17 are described as being discontinuous, but they can have a continuous shape.

Note also that the first gas, the second gas, and the third gas can be of the same type or of different types. Alternatively, those gases can be of the same type and of different purities. For example, an inert gas (such as nitrogen) having a high purity can be used as the first gas and an inert gas (such as nitrogen) having a relatively low purity can be used as the second gas and the third gas. It is desirable that the second gas and the third gas, after being neutralized, are supplied into the laser beam irradiation local seal box 10 (the same shall apply hereinafter). The discharge amount of the second gas and the third gas are not particularly limited, but it is also desirable that the discharge amount of the second gas is greater than the discharge amount of the third gas.

Next, the operation of the laser processing apparatus 1A will be described.

Like the above described first embodiment, as the substrate 120 is introduced, nitrogen gas is introduced into the laser beam irradiation local seal box 10 from the gas introduction hole 12. The nitrogen gas is discharged downward from the laser beam transmission hole 11. In addition, the second gas and the third gas are discharged from the second gas discharge ports 16 and the third gas discharge ports 17. This configuration can reduce the influence from outside the atmosphere on the inside of a local atmosphere formed by the gas discharged from the laser beam transmission hole 11.

In particular, when the substrate 120 is introduced into the processing chamber 2, outside air penetrates therein, but the discharging of the second gas and the third gas can effectively eliminate the influence due to the penetration of the outside air and can maintain a stable local atmosphere.

Further, since the gas is discharged at a discharge angle θ toward outside from the second gas discharge ports 16, therefore the influence from outside the atmosphere can be more reliably eliminated. Note that the third gas discharge ports 17 can also provided with a discharge angle (greater than 0 degree) toward outside so as to discharge the gas.

Third Embodiment

Figure 7:
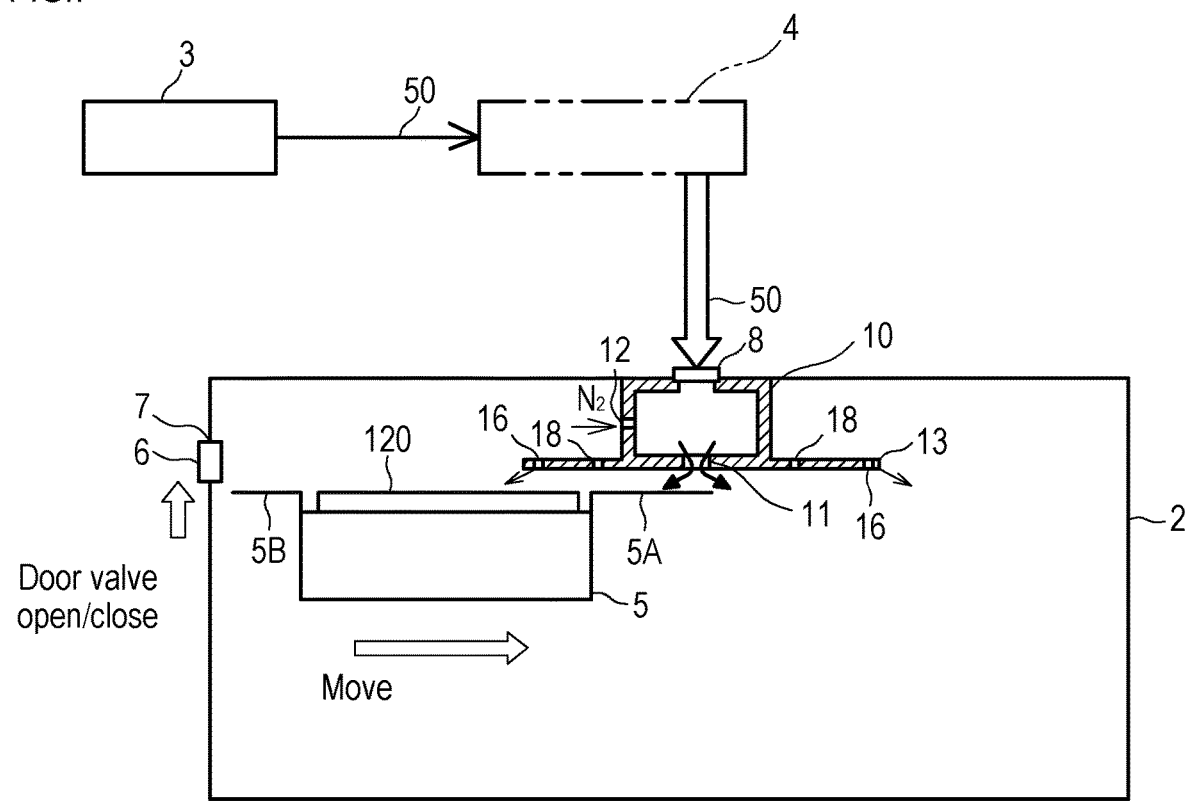
FIG. 7 is a front view illustrating an outline of a laser processing apparatus according to still another embodiment of the present invention.
Figure 8:
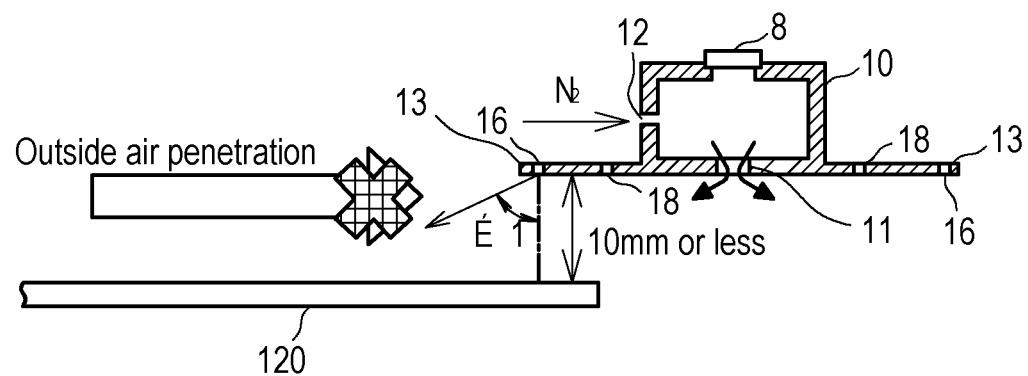
FIG. 8 is an enlarged front view illustrating a configuration around a laser beam irradiation local seal box.
Figure 9:
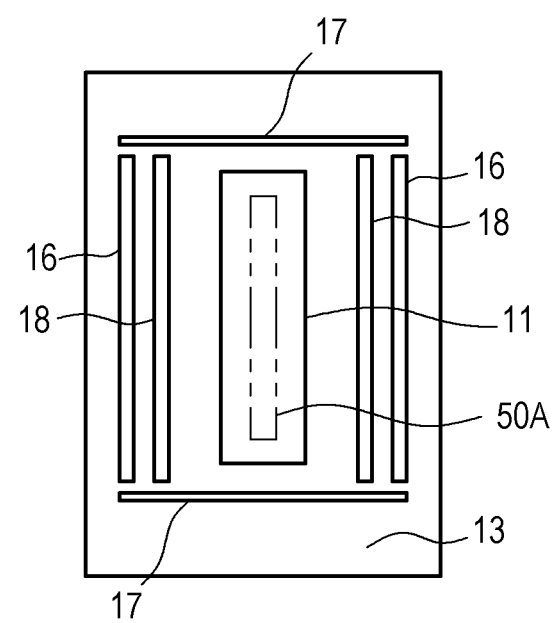
FIG. 9 is a view illustrating a bottom surface of the above laser beam irradiation local seal box.

Next, a laser processing apparatus 1B according to still another embodiment will be described with reference to FIGS. 7 to 9.

Note that in this third embodiment, the same reference numerals or characters are assigned to the components which are the same as or similar to those of the first and second embodiments, and the description is omitted or simplified.

Also, in this embodiment, the processing chamber 2 includes the laser beam irradiation local seal box 10 and the rectifying plate 13. The rectifying plate 13 has the laser beam transmission hole 11. Also, in this embodiment, the rectifying surface on a lower surface side of the rectifying plate 13 is set to have a distance of 10 mm or less from the substrate 120 moving on the stage 5.

In this third embodiment, the rectifying plate 13 includes gas front-back suction ports 18 on each of both outer sides of the laser beam irradiation local seal box 10 in the moving direction of the stage 5, and further includes a second gas discharge port 16 on each of both outer sides of the gas front-back suction ports 18. Further, the rectifying plate 13 includes a third gas discharge port 17 for discharging a third gas on each of both sides of the laser beam irradiation local seal box 10.

The gas front-back suction ports 18 and the second gas discharge ports 16 have a long-hole shape along the laser beam transmission hole 11, and have a shape exceeding each of both ends in the longitudinal direction of the laser beam transmission hole 11. It is also desirable that the gas front-back suction ports 18 are close to the laser beam transmission hole 11 or the second gas discharge ports 16 or the third gas discharge ports 17 for discharging the third gas. It is also desirable that the second gas discharge ports 16 are provided close to an outer wall of the laser beam irradiation local seal box 10.

It is also desirable that the second gas discharge ports 16 have a discharge angle θ1 for discharging to outside by taking the laser beam transmission hole 11 as a reference. It is desirable that the discharge angle θ1 is 45 degrees or more.

The third gas discharge ports 17 have a long-hole shape along a side of the laser beam transmission hole 11, and have a shape exceeding each of both ends in the short direction of the laser beam transmission hole 11. Further, it is desirable that the third gas discharge ports 17 extend to near the second gas discharge ports 16.

Note that the first gas, the second gas, and the third gas can be of the same type or of different types. Alternatively, those gases can be of the same type and of different purities. For example, an inert gas (such as nitrogen) having a high purity can be used as the first gas, and an inert gas (such as nitrogen) having a relatively low purity can be used as the second gas and the third gas.

Next, the operation of the laser processing apparatus 1B will be described.

Like the above described embodiments, as the substrate 120 is introduced, nitrogen gas is introduced into the laser beam irradiation local seal box 10 from the gas introduction hole 12. The nitrogen gas is discharged downward from the laser beam transmission hole 11. In addition, the second gas and the third gas are discharged from the second gas discharge ports 16 and the third gas discharge ports 17. Further, the gases are sucked in the gas front-back suction ports 18.

As the substrate 120 is introduced, nitrogen gas is introduced into the laser beam irradiation local seal box 10 from the gas introduction hole 12. The nitrogen gas is discharged downward from the laser beam transmission hole 11. Further, the gas is sucked in the gas front-back suction ports 18. The gas discharged from the laser beam transmission hole 11 is sucked from the gas front-back suction ports 18 thereby to form a stable flow of the gas.

In addition, the second gas and the third gas are discharged from the second gas discharge ports 16 and the third gas discharge ports 17. This configuration can reduce the influence from outside the atmosphere on the inside of a local atmosphere formed by the nitrogen gas discharged from the laser beam transmission hole 11 and flowing into the gas front-back suction ports 18, which is found to be particularly effective in stabilizing the local atmosphere.

In particular, when the substrate 120 is introduced into the processing chamber 2, outside air penetrates therein, but this configuration can effectively eliminate the influence due to the penetration of the outside air and maintain a stable local atmosphere.

Further, since the gas is discharged at a discharge angle θ1 toward outside from the second gas discharge ports 16, the influence from outside the atmosphere can be more reliably eliminated. Note that the third gas discharge ports 17 can also provided with a discharge angle (greater than 0 degree) toward outside.

Further, a gas side suction port can be provided between the third gas discharge ports 17 and the laser beam transmission hole 11.

Fourth Embodiment

Figure 10:
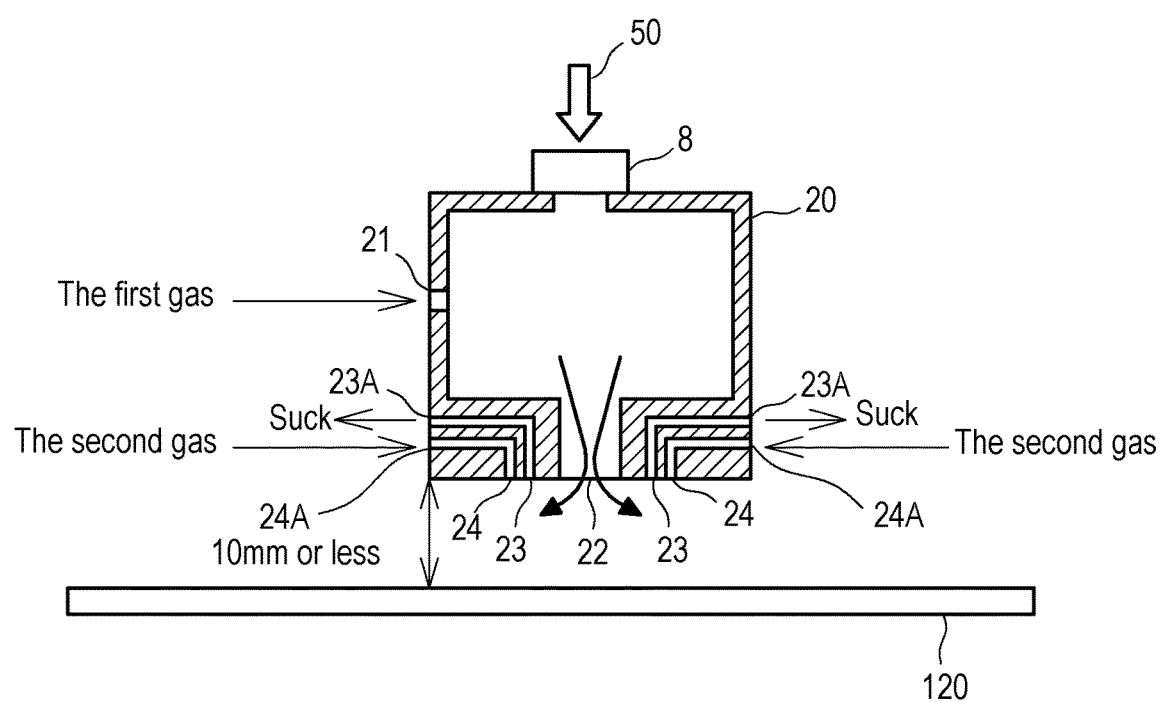
FIG. 10 is a view illustrating a laser beam irradiation local seal box provided in a laser processing apparatus according to still another embodiment of the present invention.

Next, a fourth embodiment will be described with reference to FIG. 10.

The fourth embodiment changes the shape of the laser beam irradiation local seal box and uses a lower surface of the laser beam irradiation local seal box 20 as a rectifying surface. The rectifying surface has a distance of 10 mm or less from the moving substrate 120.

The laser beam irradiation local seal box 20 includes an elongated laser beam transmission hole 22 located at a center of the lower surface thereof; and a gas front-back suction port 23 located on each of both outer sides of the laser beam transmission hole 22 in the moving direction. The gas front-back suction ports communicate with gas suction holes 23A provided in the laser beam irradiation local seal box 20, via a path passing through a wall portion of the laser beam irradiation local seal box 20. The gas suction holes 23A are connected to a non-illustrated pump or the like. The gas front-back suction ports 23 have a long-hole shape along the laser beam transmission hole 22 and have a shape exceeding each of both ends in the longitudinal direction of the laser beam transmission hole 22. In addition, it is desirable that the gas front-back suction ports 23 are provided at a position near the laser beam transmission hole 22.

Further, a second gas discharge port 24 is formed on each of both outer sides of the gas front-back suction ports 23. The second gas discharge ports 24 communicate with gas supply holes 24A provided in the laser beam irradiation local seal box 20, via a path passing through a lower wall portion of the laser beam irradiation local seal box 20. The gas supply holes 24A are connected to a non-illustrated gas supply unit or the like.

In addition, although not illustrated, a third gas discharge port for discharging the third gas is provided on each of both sides of the laser beam transmission hole 22.

The second gas discharge ports 24 have a long-hole shape along the laser beam transmission hole 22 and have a shape exceeding each of both ends in the longitudinal direction of the laser beam transmission hole 22. In addition, it is desirable that the second gas discharge ports 24 are provided at a position further than the gas front-back suction ports 23 from the laser beam transmission hole 22. Further, the third gas discharge ports have a long-hole shape along a side surface of the laser beam transmission hole 22 and have a shape exceeding each of both ends in the short direction of the laser beam transmission hole 22.

In this embodiment, nitrogen gas is introduced into the laser beam irradiation local seal box 20 from the gas introduction hole 21. The nitrogen gas is discharged downward from the laser beam transmission hole 22. In addition, the second gas and the third gas are discharged from the second gas discharge ports 24 and the third gas discharge ports. Further, the gases are sucked in the gas front-back suction ports 23.

The gas discharged from the laser beam transmission hole 11 is sucked in the gas front-back suction ports 23 thereby to form a stable flow of the gas.

In addition, the second gas and the third gas are discharged from the second gas discharge ports 24 and the third gas discharge ports. This configuration can reduce the influence from outside the atmosphere on the inside of a local atmosphere formed by the nitrogen gas discharged from the laser beam transmission hole 22 and flowing into the gas front-back suction ports 23.

Further, the gas is discharged downward from the second gas discharge ports 24 thereby to eliminate the influence from outside the atmosphere.

Fifth Embodiment

Figure 11:
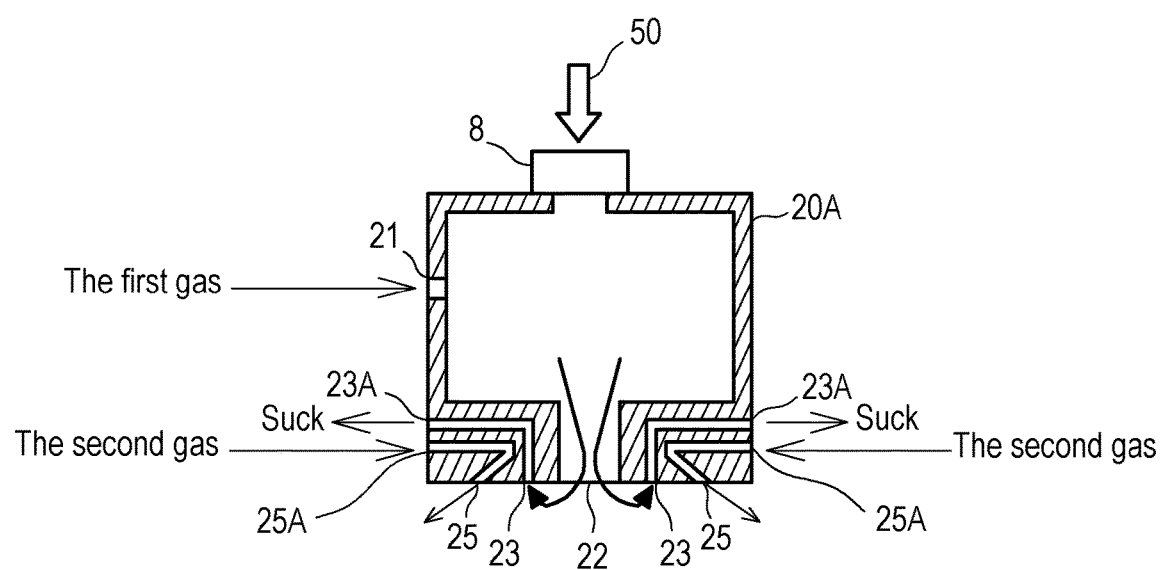
FIG. 11 is a view illustrating a laser beam irradiation local seal box provided in a laser processing apparatus according to still another embodiment of the present invention.
Figure 12:
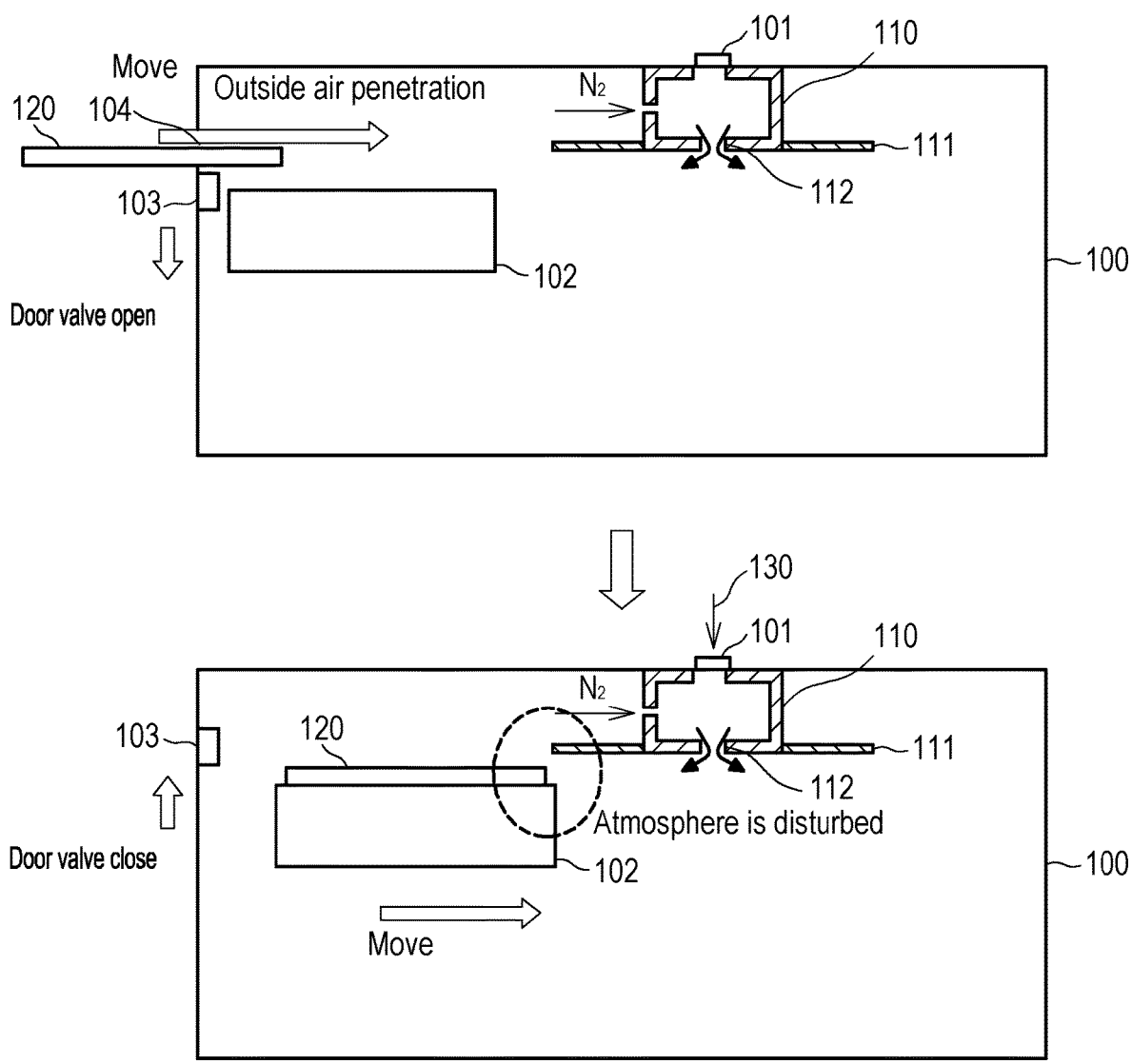
FIG. 12 is a front view illustrating an outline of a conventional laser processing apparatus and illustrating a state during laser beam processing when the substrate is introduced and after the substrate is placed.

Next, a fifth embodiment will be described with reference to FIG. 11.

Note that in this embodiment, the same reference numerals or characters are assigned to the components which are the same as or similar to those of the above described embodiments, and the description is omitted or simplified.

Like the fourth embodiment, this embodiment uses a lower surface of the laser beam irradiation local seal box 20A as a rectifying surface. The rectifying surface has a distance of 10 mm or less from the moving substrate 120.

The laser beam irradiation local seal box 20A includes an elongated laser beam transmission hole 22 located at a center of the lower surface thereof; and a gas front-back suction port 23 located on each of both outer sides of the laser beam transmission hole 22 in the moving direction. The gas front-back suction ports 23 communicate with gas suction holes 23A provided in the laser beam irradiation local seal box 20A, via a path passing through a wall portion of the laser beam irradiation local seal box 20. The gas suction holes 23A are connected to a non-illustrated pump or the like. The gas front-back suction ports 23 have a long-hole shape along the laser beam transmission hole 22 and have a shape exceeding each of both ends in the longitudinal direction of the laser beam transmission hole 22.

Further, a second gas discharge port 25 is formed on each of both outer sides of the gas front-back suction ports 23. The second gas discharge ports 25 communicate with gas supply holes 25A provided in the laser beam irradiation local seal box 20A, via a path passing through a lower wall portion of the laser beam irradiation local seal box 20A. The gas supply holes 25A are connected to a non-illustrated gas supply unit or the like.

In addition, although not illustrated, a third gas discharge port for discharging the third gas is provided on each of both sides of the laser beam transmission hole 22.

The second gas discharge ports 25 have a long-hole shape along the laser beam transmission hole 22 and have a shape exceeding each of both ends in the longitudinal direction of the laser beam transmission hole 22. In addition, it is desirable that the second gas discharge ports 25 are provided at a position further than the gas front-back suction ports 23 from the laser beam transmission hole 22. Further, the third gas discharge ports have a long-hole shape along a side surface of the laser beam transmission hole 22 and have a shape exceeding each of both ends in the short direction of the laser beam transmission hole 22.

Note that the second gas discharge ports 25 have a discharge angle inclined towards outside in the moving direction of the substrate 120 by taking the laser beam transmission hole 22 as a reference, and it is desirable that the discharge angle is 45 degrees or more.

When nitrogen gas is introduced into the laser beam irradiation local seal box 20A from the gas introduction hole 21, the nitrogen gas is discharged downward from the laser beam transmission hole 22. In addition, the second gas and the third gas are discharged from the second gas discharge ports 25 and the third gas discharge ports. Further, the gases are sucked in the gas front-back suction ports 23.

The gas discharged from the laser beam transmission hole 22 is sucked in the gas front-back suction ports 23 thereby to form a stable flow of the gas.

In addition, the second gas and the third gas are discharged from the second gas discharge ports 25 and the third gas discharge ports. This configuration can reduce the influence from outside the atmosphere on the inside of a local atmosphere formed by the nitrogen gas discharged from the laser beam transmission hole 22 and flowing into the gas front-back suction ports 23.

Further, the gas is discharged at a discharge angle toward outside from the second gas discharge ports 25, which can more reliably eliminate the influence from outside the atmosphere. Note that the third gas discharge ports can also provide with a discharge angle (greater than 0 degree) toward outside.

Each of the above described embodiments can provide the following effects:
1. Gas is not injected from the laser beam irradiation position toward the substrate, thereby to eliminate the reasons disturbing the laminar flow due to any gas.
2. The rectifying plate for forming the laminar flow can be designed to be long without being folded, thereby to enable better flow rectification.
3. Substances such as vapor or fine particles generated from the irradiated object are discharged towards one direction and thus can be quickly removed from the optical path of the laser.

4. If there are many substances such as vapor or fine particles generated from the irradiated object, this problem can be solved by increasing the flow velocity.
5. Particles from outside can be removed.
6. Stabilization time can be shortened.
7. Static electricity can be eliminated.

In sort, each of the above described embodiments can form a uniform flow velocity and pressure distribution by using any gas by the flowing of any gas between a workpiece and a rectifying surface placed parallel to the workpiece. Further, a uniform irradiation atmosphere can be formed by eliminate substances such as vapor or fine particles generated from workpiece from the optical path of the laser beam by using this gas flow, and an external gas flow can be prevented from entering the irradiation position without disturbing a stable atmosphere formed by providing a gas injection portion in the rectifying surface.

It should be noted that each of the above embodiments have been described using a substrate as the workpiece, but in the present invention, the workpiece is not limited to the substrate. Further, the present invention has been described as crystallizing a non-single crystal, but the processing content of the laser processing apparatus is not limited to this processing and the present invention can also be applied to a flexible substrate such as a metal substrate and a plastic substrate.

Example 1

Hereinafter, an example of the present invention will be described.

In the example, the test is conducted under the following conditions.

| | |
|---|---|
| a (Amorphous) - Si film thickness | 50 nm |
| Excimer laser | Vyper/wavelength 308 nm, 600 Hz |
| Beam size | 750 mm × 0.4 mm |
| Irradiation energy density | 370 mJcm$^{-2}$ |
| Beam steepness | 70 μm |

The gas feeding unit B is disposed around the laser beam irradiation position. In order to change the irradiation atmosphere to the inert gas atmosphere, the gas discharge speed of the gas suction unit is adjusted according to the flow rate of the inert gas flowing into the seal box.

As a result, it is found that a stable local atmosphere is formed around the laser beam irradiation area and oxygen concentration does not rise during replacement of substrates, thereby less time is required for stabilization and productivity is improved.

Hereinbefore, the present invention has been described based on the above embodiments and examples, but appropriate modifications can be made to each of the above embodiments without departing from the scope of the present invention.

REFERENCE SIGNS LIST 1 laser processing apparatus
1A laser processing apparatus
1B laser processing apparatus
2 processing chamber
3 laser light source
4 optical system
5 stage
6 door valve
7 inlet/outlet port
8 laser beam introduction window
10 laser beam irradiation local seal box
11 laser beam transmission hole
12 gas introduction hole
13 rectifying plate
15 gas front-back suction port
16 the second gas discharge port
17 the third gas discharge port
18 gas front-back suction port
20 laser beam irradiation local seal box
23 laser beam transmission hole
23 gas front-back suction port
24 the second gas discharge port
25 the second gas discharge port
50 laser beam
50A irradiation area

The invention claimed is:

1. A laser processing apparatus that irradiates a workpiece with a laser beam while relatively scanning the laser beam, the laser processing apparatus comprising:
a laser light source that irradiates the workpiece with the laser beam; and
a rectifying surface provided at a position facing the workpiece during laser beam irradiation,
wherein at least one of the workpiece and the laser beam is movable along a scanning direction,
wherein the rectifying surface is provided with:
a first gas discharge port through which a first gas is discharged to an irradiation area irradiated with the laser beam in the workpiece during the laser beam irradiation;
a second gas discharge port through which a second gas is discharged to the workpiece during the laser beam irradiation; and
a gas front-back suction port,
wherein the second gas discharge port and the gas front-back suction port are both provided on at least one of respective outer sides of the first gas discharge port in the scanning direction,
wherein the second gas discharge port and the gas front-back suction port are located adjacent to each other such that the gas front-back suction port is located between the second gas discharge port to which it is adjacent and the first gas discharge port,
wherein the rectifying surface is further provided with a third gas discharge port through which a third gas is discharged to the workpiece during the laser beam irradiation, and
wherein a long axis of the third gas discharge port extends along the scanning direction, and the third gas discharge port is provided on at least one of respective outer sides of the irradiation area in a width direction perpendicular to the scanning direction so as to be lateral to the irradiated area along the width direction.

2. The laser processing apparatus according to claim 1, wherein the first gas discharge port is one through which the first gas is discharged in a range covering the irradiation area.

3. The laser processing apparatus according to claim 1, wherein each of the second gas discharge port and the gas front-back suction port has a shape that is longer than a shape of the irradiation area along a width direction perpendicular to the scanning direction, and that extends beyond both outer edges of the irradiation area along the width direction.

4. The laser processing apparatus according to claim 1, wherein the third gas discharge port has a shape that is longer than a shape of the irradiation area along the scanning direction, and that extends beyond both outer edges of the irradiation area along the scanning direction.

5. The laser processing apparatus according to claim 1, wherein the second gas discharge port has a discharge angle directed downwardly outward at an angle different from a discharge angle of the first gas discharge port.

6. The laser processing apparatus according to claim 5, wherein the discharge angle of the second gas discharge port is at least 45 degrees.

7. The laser processing apparatus according to claim 1, wherein the rectifying surface is spaced apart from the workpiece by a distance of at most 10 mm during the relative movement between the workpiece and the laser beam.

8. The laser processing apparatus according to claim 1, wherein the rectifying surface extends at least 10 mm more than a length of the laser beam on the irradiation surface in the scanning direction as measured starting from the first gas discharge port.

9. The laser processing apparatus according to claim 1, wherein the second gas discharge port is located at a distance of at least 1 mm in the scanning direction from the first gas discharge port.

10. The laser processing apparatus according to claim 1, wherein the laser beam has a line beam shape on the irradiation surface with respect to the workpiece.

11. The laser processing apparatus according to claim 1, wherein the workpiece is a non-single-crystal semiconductor, and the laser processing apparatus crystallizes the non-single-crystal semiconductor.

12. The laser processing apparatus according to claim 1, wherein the second gas and the third gas are neutralized and supplied to the second gas discharge port and the third gas discharge port, respectively.

13. The laser processing apparatus according to claim 1, wherein the gas discharged from the rectifying surface is an inert gas.

14. The laser processing apparatus according to claim 2, wherein each of the second gas discharge port and the gas front-back suction port has a shape that is longer than a shape of the irradiation area along a width direction perpendicular to the scanning direction, and that extends beyond both outer edges of the irradiation area along the width direction.

15. The laser processing apparatus according to claim 2, wherein the third gas discharge port is provided on both of the respective outer sides of the irradiation area along the width direction.

* * * * *